United States Patent
Hirose

(10) Patent No.: US 6,562,728 B2
(45) Date of Patent: May 13, 2003

(54) SURFACE TREATMENT METHOD OF GERMANIUM-CONTAINING SEMICONDUCTOR SUBSTRATE THAT INCLUDES IMMERSION OF THE SUBSTRATE IN CHEMICAL SOLUTIONS TO REMOVE FOREIGN MATTER

(75) Inventor: Fumihiko Hirose, Yokohama (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 0 days.

(21) Appl. No.: 10/012,399

(22) Filed: Dec. 12, 2001

(65) Prior Publication Data

US 2002/0052072 A1 May 2, 2002

(30) Foreign Application Priority Data

Sep. 11, 2001 (JP) ........................... 2001-275255

(51) Int. Cl.[7] .............................................. H01L 21/00
(52) U.S. Cl. ...................... 438/749; 438/752; 438/906
(58) Field of Search ................................ 438/749, 752, 438/906, 94, 235, 312

(56) References Cited

U.S. PATENT DOCUMENTS

| | | | | |
|---|---|---|---|---|
| 5,821,158 A | * | 10/1998 | Shishiguchi | 438/528 |
| 5,920,795 A | * | 7/1999 | Suzuki | 438/680 |
| 6,239,039 B1 | * | 5/2001 | Nihonmatsu et al. | 438/749 |
| 6,290,859 B1 | * | 9/2001 | Fleming et al. | 216/2 |
| 6,380,479 B2 | * | 4/2002 | Nakai et al. | 136/246 |
| 6,399,993 B1 | * | 6/2002 | Ohnishi et al. | 257/370 |
| 6,423,989 B1 | | 7/2002 | Nakano | |
| 2001/0003680 A1 | * | 6/2001 | Brunner et al. | 438/745 |

FOREIGN PATENT DOCUMENTS

| | | |
|---|---|---|
| DE | 37 38 651 | 5/1989 |
| DE | 197 38 147 | 3/1999 |
| DE | 198 33 257 | 9/1999 |
| DE | 199 26 462 | 11/2000 |
| DE | 100 04 578 | 7/2001 |

* cited by examiner

Primary Examiner—Carl Whitehead, Jr.
Assistant Examiner—Stephen W. Smoot
(74) Attorney, Agent, or Firm—Oblon, Spivak, McClelland, Maier & Neustadt, P.C.

(57) ABSTRACT

The surface cleaning method of semiconductor substrate comprises, the steps of, immersing a substrate of a first conductive type having Ge or SiGe mixing Ge and Si at least in the surface layer in a solution of hydrofluoric acid, and removing foreign matters from the surface of the substrate without overetching the surface of the substrate, pouring pure water on the substrate to wash away the solution of hydrofluoric acid applied at the step (a) from the surface of the substrate, and immersing the substrate in a solution of hydrogen peroxide, and removing foreign matters from the surface of the substrate without overetching the surface of the substrate.

13 Claims, 4 Drawing Sheets

50μm

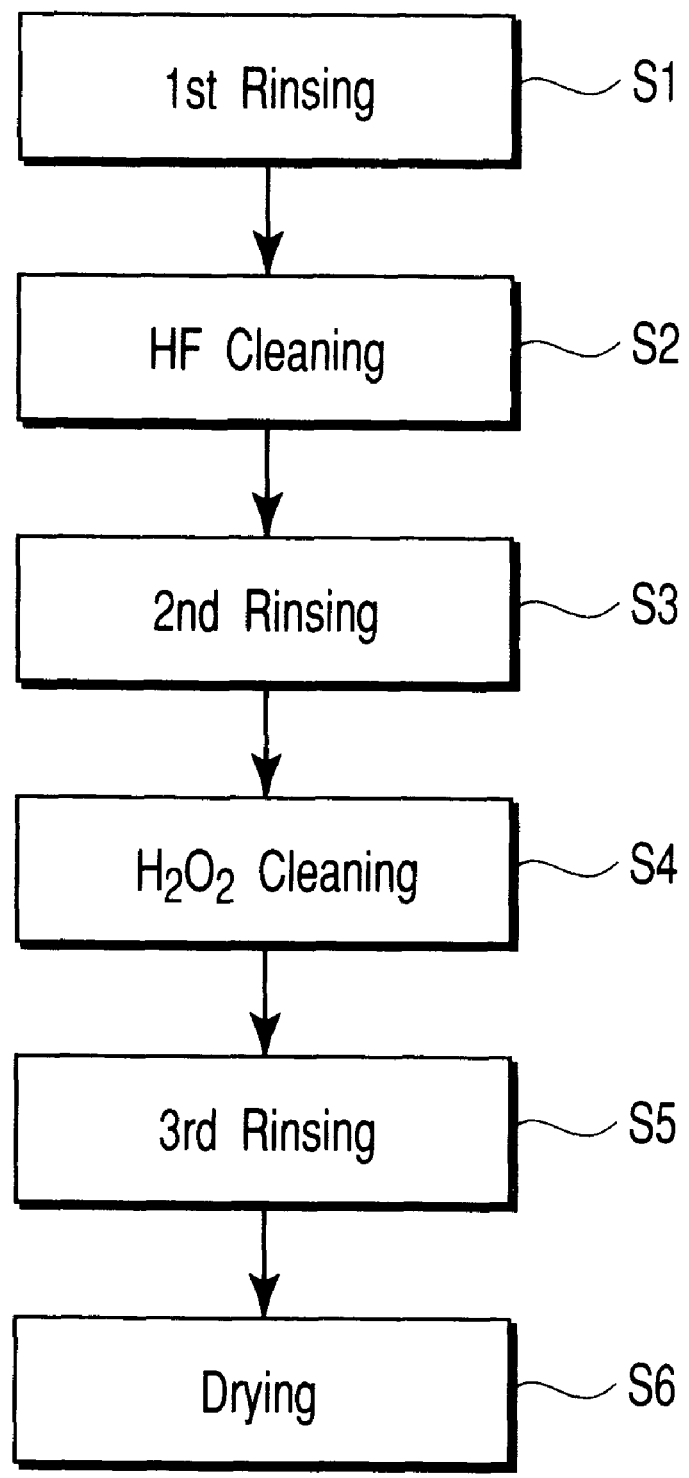
F I G. 5

SURFACE TREATMENT METHOD OF GERMANIUM-CONTAINING SEMICONDUCTOR SUBSTRATE THAT INCLUDES IMMERSION OF THE SUBSTRATE IN CHEMICAL SOLUTIONS TO REMOVE FOREIGN MATTER

CROSS-REFERENCE TO RELATED APPLICATIONS

This application is based upon and claims the benefit of priority from the prior Japanese Patent Application No. 2001-275255, filed Sep. 11, 2001.

BACKGROUND OF THE INVENTION

1. Field of the Invention

The invention relates to a surface treatment method of semiconductor substrate used in an electronic device having an SiGe/Si hetero junction.

2. Description of the Related Art

A semiconductor substrate utilizing germanium in formation of pn junction is preferably used in infrared detectors of high sensitivity and diodes. A SiGe substrate (or film) or Ge containing substrate (or film) incorporated in these electronic devices must be brought into contact with an Si film (or substrate). In this case, before the SiGe substrate (or film) or Ge containing substrate (or film) is brought into contact with the Si film (or substrate), it is important to clean the surface of the SiGe substrate (or film) or Ge containing substrate (or film) to remove impurities from the surface (impurity metal, oxide, carbide, etc.).

If surface cleaning of the SiGe substrate (or film) or Ge containing substrate (or film) is insufficient, impurity elements such as oxygen, carbon, and metal are left over on the surface, and when the Si film is deposited on the surface, stacking faults or point defects may be generated from these impurities. When the defect density on the pn junction boundary increases, it forms recombination centers, which cause the leak current in the pn junction when an inverse bias is applied to the pn junction. If a semiconductor substrate of such junction structure having a high defect density is incorporated in an electronic device (transistor or diode), probability of causing malfunction is high.

A hetero junction bipolar transistor (HBT) and a field effect transistor are known as electronic devices operating at high speed, and are widely used in communications and high speed signal processing. To further enhance the operation speed of such devices, a silicon-germanium film (SiGe film) is used.

In the HBT as shown in FIG. 6, if impurities are left over on the hetero junction boundary or surface of SiGe film 101, a leak current may be generated at the pn junction potential. Such leak current is one of the causes of failure of electronic device.

Impurities (foreign matters) left over on the SiGe surface or Ge surface are classified into three types as follows.

1) Oxides such as $SiO_2$ and $GeO_2$
2) Carbon impurities such as hydrocarbon
3) Metal impurities such as Na, K, and Fe Oxides are films naturally formed on the substrate surface when the surface of SiGe or Ge contacts with the atmosphere. Such oxide films are called natural oxide films, and the film thickness is about several nm to 20 nm.

Electronic devices using SiGe substrates or Ge substrates are manufactured in a device production plant using Si substrates. As chemical cleaning technology employed in a device production plant for Si, generally, the RCA method is known (W. Kern and D. A. Puotinen, RCA Vol. 31, 1970, 187).

The typical RCA method is executed in the following procedure (a to 1).

a. Cleaning in ultrapure water for several minutes.
b. Immersing in mixed solution of $NH_4OH$, $H_2O_2$, and $H_2O$ (1:2:7) at 75° C. for more than several minutes.
c. Cleaning in ultrapure water for several minutes.
d. Immersing in 1% hydrofluoric acid at room temperature for several minutes.
e. Cleaning in ultrapure water for several minutes.
f. Immersing in mixed solution of HCl, $H_2O_2$, and $H_2O$ (1:2:7) at room temperature for more than several minutes.
g. Cleaning in ultrapure water for several minutes.
h. Immersing in 1% hydrofluoric acid at room temperature for several minutes.
i. Cleaning in ultrapure water for several minutes.
j. Immersing in mixed solution of $H_2SO_4$, $H_2O_2$, and $H_2O$ (1:2:7) at room temperature for more than several minutes.
k. Cleaning in ultrapure water for several is minutes.
l. Drying by spin rotation.

Although the RCA method has been proved to be excellent for cleaning of Si substrate, but it is inappropriate for cleaning of SiGe substrate (or film) or Ge containing substrate (or film). That is because when the surface of SiGe substrate (or film) or Ge containing substrate (or film) is cleaned by RCA method, the surface is seriously roughened. If Si layer or metal layer is deposited on the SiGe substrate (or film) or Ge containing substrate (or film) thus having lost flatness, the defect incidence rate of final products of electronic devices is heightened, and the yield is lowered.

BRIEF SUMMARY OF THE INVENTION

It is hence an object of the invention to present a surface treatment method of semiconductor substrate capable of removing impurities from the surface of a substrate having a surface layer composed of Ge or SiGe, achieving the flat surface and reducing the defect density on the hetero junction boundary.

The surface cleaning method of semiconductor substrate according to an aspect of the invention comprises (a) immersing a substrate having Ge or SiGe mixing Ge and Si at least in the surface layer in a solution of hydrofluoric acid, and removing impurities from the surface of the substrate without overetching the surface of the substrate, (b) pouring pure water on the substrate to wash away the solution of hydrofluoric acid applied in the step (a) from the surface of the substrate, and (c) immersing the substrate in a solution of hydrogen peroxide, and removing foreign matters from the surface of the substrate without overetching the surface of the substrate.

Further, a step (d) may be also a step of pouring pure water on the substrate to wash away the solution of hydrogen peroxide applied in the step (c) from the surface of the substrate, and removing the water applied on the surface of the substrate and then drying the substrate. On the dry surface of the substrate, a next thin film layer is deposited.

Prior to the step (a), preferably, the substrate is washed by running water. As a result, particle deposited on the surface are washed away from the substrate.

The solution of hydrofluoric acid used at step (a) preferably contains hydrofluoric acid by 1 mass % or more to 5 mass % or less. If the concentration of hydrofluoric acid exceeds 5 mass %, the surface of the substrate is overetched. On the other hand, if the concentration of hydrofluoric acid is less than 1 mass %, it takes too much time in processing, and impurities cannot be removed sufficiently. At this step (a), oxides such as $SiO_2$ and $GeO_2$ are removed from the surface of the substrate.

In the step (c), an oxide film of 1.0 nm or less in thickness is formed on the surface of the substrate. Such thin oxide film effectively prevents carbide foreign matters in the atmosphere (especially hydrocarbon) from sticking to the surface of the substrate.

In the step (b) or (d), a washing vessel is filled with pure water, the substrate is immersed in pure water in the washing vessel, and pure water is further supplied into the washing vessel while pure water is discharged from the washing vessel to form a flow of pure water in the washing vessel, and the surface of the substrate contacts with a running flow of pure water. As a result, the solution of hydrofluoric acid is removed from the substrate, and the solution of hydrofluoric acid is prevented from being mixed with the solution of hydrogen peroxide at the next step.

Further, putting substrates in a carrier, and arranging a vessel containing a solution of hydrofluoric acid, a vessel containing running flow of pure water, and a vessel containing a solution of hydrogen peroxide sequentially in series, preferably, in the step (a), the carrier containing the substrates is conveyed into the vessel of solution of hydrofluoric acid, the carrier containing the substrates is immersed in the solution of hydrofluoric acid, and the carrier containing the substrates is lifted from the solution of hydrofluoric acid, in the step (b), the carrier containing the substrates is transferred from the vessel of solution of hydrofluoric acid into the vessel of running flow of pure water, the carrier containing the substrates is immersed in the running flow of pure water, and the carrier containing the substrates is lifted from the running flow of pure water, and in the step (c) the carrier containing the substrates is transferred from the vessel of running flow of pure water into the vessel of solution of hydrogen peroxide, the carrier containing the substrates is immersed in the solution of hydrogen peroxide, and the carrier containing the substrates is lifted from the solution of hydrogen peroxide. By using such carrier, it is easier to immerse the substrates in and lift from the washing vessels in the continuous line, and the through-put of the treatment is substantially enhanced. It is preferred to contain a plurality (for example, 5 to 20) of substrates in the carrier, but it is possible to put only one substrate.

In the step (a), it is preferred to immerse the substrate in the solution of hydrofluoric acid at room temperature for at least one minute. At room temperature, however, when the substrate is immersed in the solution of hydrofluoric acid of, for example, 6% for more than 10 minutes, it causes overetching, and therefore, the substrate should not be immersed for a long time in a high-concentration solution of hydrofluoric acid.

In the step (b), preferably, the substrate is immersed in the running flow of pure water at room temperature for at least one minute.

In the washing steps (b) and (d) of substrate, it is recommended to use ultrapure water. Herein, ultrapure water refers to water satisfying the water quality standard of resistivity (specific resistance) of 13 MΩ·cm or more, particle count of 30 or less per milliliter, and living bacteria count of 1 or less per milliliter.

Further, in order that the defect density on the hetero junction boundary may be $3\times10^{13}/cm^2$ or less when a hetero junction is formed by depositing a Ge film or SiGe film mixing Ge and Si of second conductive type on the substrate, oxides, metal impurities, and carbon impurities are removed from the surface of the substrate in the steps (a) to (d). If the defect density increases on the hetero junction boundary, a leak current is generated on the junction boundary, and the basic function as electronic device deteriorates. For example, in the case of a diode, when the leak current increases, the breakdown voltage decreases, and a short circuit is formed in a worst case, and the diode fails to perform its basic rectifying action.

In the step (a), then substrate is cleaned in the solution of hydrofluoric acid, and oxides such as $SiO_2$ and $GeO_2$ are removed from the surface layer. Although SiGe or Ge on the surface is oxidized in the atmosphere in a short time, oxides formed by such oxidation are effectively removed in the step (a).

In the step (c), the substrate is cleaned in the solution of hydrogen peroxide, and the surface layer is slightly etched and oxidized. By cleaning in the step (c), carbide and metal impurities are removed from the surface layer of the substrate.

After the step (c), it is important to control the thickness of the oxide layer of the substrate surface layer at 1.0 nm or less, preferably 0.5 nm or less. Such a thin oxide layer can be easily removed by the subsequent heat treatment or reduction process. Such oxide layer effectively prevents hydrocarbon in the atmosphere from sticking again to the surface of the substrate when conveying the substrate taken out from the cleaning vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a flowchart showing a surface cleaning method of semiconductor substrate in an embodiment of the invention.

DETAILED DESCRIPTION OF THE INVENTION

Referring now to the accompanying drawings, preferred embodiments of the invention are described in detail below.

Figure 1:
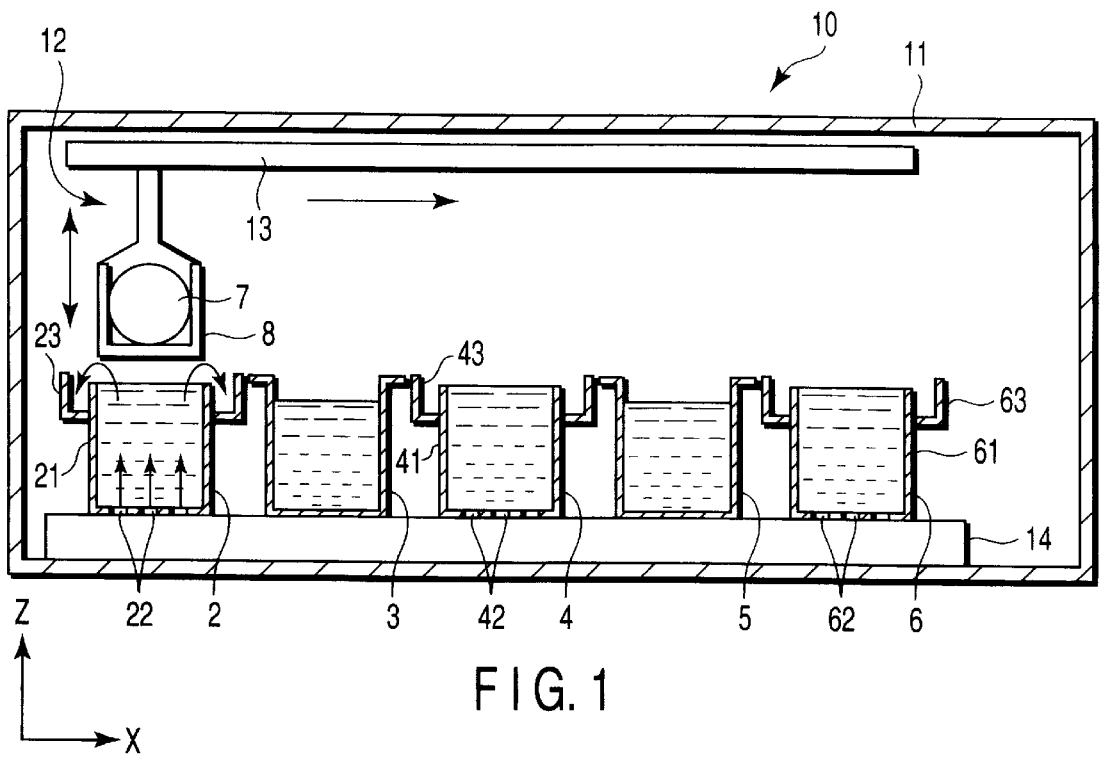
FIG. 1 is an internal perspective sectional view showing an outline of an apparatus used in surface cleaning method of semiconductor substrate in the invention.

First, referring to FIG. 1, the apparatus used in the surface treatment method of semiconductor substrate according to an embodiment of the invention is described below. A cleaning apparatus 10 has its outer circumference surrounded with a wall of a chamber 11. An upper opening of the chamber 11 communicates with an exhaust device not shown, so that the chamber 11 may be always ventilated. In this drafter chamber 11, five vessels 2, 3, 4, 5, and 6 are arranged in series straightly in the X-axis direction. These five vessels 2 to 6 are disposed on a liquid supply unit 14.

The liquid supply unit 14 incorporates containers, pumps and piping, and is configured to supply treating solutions (ultrapure water, solution of hydrofluoric acid, solution of hydrogen peroxide) to the vessels 2, 3, 4, 5, 6.

In the first, third and fifth vessels 2, 4, 6, ultrapure water is circulated and supplied from the liquid supply unit 14. The vessels 2, 4, 6 are composed of main vessels 21, 41, 61, and overflow vessels 23, 43, 63, respectively, and supply ports 22, 42, 62 are opened in the bottom of the main vessels 21, 41, 61.

Ultrapure water is supplied from the liquid supply unit 14 into the main vessels 21, 41, 61 through the supply ports 22, 42, 62, overflows from the main vessels 21, 41, 61 into the overflow vessels 23, 43, 63, returns from the overflow vessels 23, 43, 63 to the liquid supply unit 14, pass through filters, ion exchangers and others, and supplied again into the vessels 2, 4, 6.

In the second vessel 3, a solution of hydrofluoric acid is supplied from the liquid supply unit 14, and the deteriorated solution of hydrofluoric acid (low purity liquid) is exchanged with a fresh solution of hydrofluoric acid (high purity liquid).

In the fourth vessel 5, a solution of hydrogen peroxide is supplied from the liquid supply unit 14, and the deteriorated solution of hydrogen peroxide (low purity liquid) is exchanged with a fresh solution of hydrogen peroxide (high purity liquid).

In the upper part of the chamber 11, a conveying robot 12 and a guide rail 13 are provided. The conveying robot 12 has a chuck mechanism for holding a carrier 8, and is movable in the X-axis direction along the guide rail 13, and can also ascend and descend in the Z-axis direction.

A loader (not shown) is provided at one side of the chamber 11, and substrates 7 are loaded into the carrier 8 by a transfer mechanism (not shown). An unloader (not shown) is provided at other side of the chamber 11, and substrates are unloaded from the carrier 8 by a transfer mechanism (not shown). Thus, the carrier 8 is exchanged between these transfer mechanisms and the conveying robot 12.

Surface treatment of substrates 7 by such cleaning apparatus 10 is explained below. In the loader, the transfer mechanism puts plural substrates 7 into the carrier 8 at equal pitch intervals in upright position, and transfers to the conveying robot 12. The conveying robot 12 conveys the carrier 8 into the first vessel 2, and immerses the substrates 7, together with the carrier 8, in the ultrapure water in the first vessel 2. The ultrapure water in the first vessel 2 is running from bottom to top, and particles are removed from the surface of substrates 7 by this running water.

Next, the conveying robot 12 conveys the carrier 8 into the second vessel 3, and immerses the substrates 7, together with the carrier 8, in the solution of hydrofluoric acid in the second vessel 3, and lifts off after holding for a specified time. By the solution of hydrofluoric acid, oxide impurities are removed from the surface of substrates 7.

Then, the conveying robot 12 conveys the carrier 8 into the third vessel 4, and immerses the substrates 7, together with the carrier 8, in the ultrapure water in the third vessel 4. The ultrapure water in the third vessel 4 is running from bottom to top, and the solution of hydrofluoric acid is removed from the surface of substrates 7 by this running water.

Consequently, the conveying robot 12 conveys the carrier 8 into the fourth vessel 5, and immerses the substrates 7, together with the carrier 8, in the solution of hydrogen peroxide in the fourth vessel 5, and lifts off after holding for a specified time. By the solution of hydrogen peroxide, metal and carbide impurities are removed from the surface of substrates 7.

Further, the conveying robot 12 conveys the carrier 8 into the fifth vessel 6, and immerses the substrates 7, together with the carrier 8, in the ultrapure water in the fifth vessel 6. The ultrapure water in the fifth vessel 6 is running from bottom to top, and the solution of hydrogen peroxide is removed from the surface of substrates 7 by this running water.

In succession, the conveying robot 12 transfers the carrier 8 to the transfer mechanism of the unloader. The transfer unit then transfers the carrier 8 to a spin dryer (not shown). The substrates 7 are rotated by spinning, together with the carrier 8, by the spin dryer, and remaining liquid is removed from the substrates 7, and they are dried.

EXAMPLE 1

Figure 2:
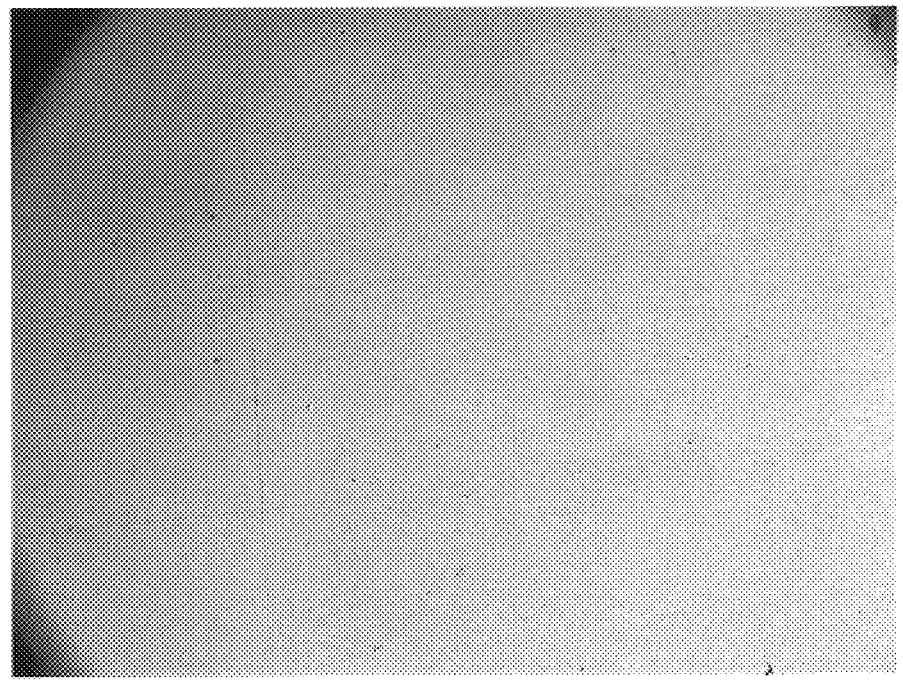
FIG. 2 is a microscopic photograph showing the surface of Ge substrate cleaned by a surface cleaning method of semiconductor substrate in a first embodiment of the invention.

Referring next to FIG. 5 and FIG. 2, a method of Example 1 is explained.

As the substrates to be cleaned, Ge wafers 7 were prepared. The Ge wafer 7 is comprised by germanium purity of 99.99 mass %, plane azimuth of (100), diameter of 2 inches, and thickness of 1.0 mm.

A plurality of (for example, five) wafers 7 were put in the carrier 8 at equal pitch intervals in upright position, and together with the carrier 8, the wafers 7 were conveyed into the loader. The conveying robot 12 received the carrier 8 from the transfer mechanism of the loader, and conveyed it into the first vessel 2. Together with the carrier 8, the Ge wafers 7 were immersed in ultrapure water in the first vessel 2, and cleaned in running water for five minutes (step S1).

Next, the wafers 7, together with the carrier 8, were immersed in solution of hydrofluoric acid in the second vessel 3 for one minute. Herein, a solution of hydrofluoric acid at concentration of 5 mass % was used (step S2).

Then, the wafers 7, together with the carrier 8, were immersed in ultrapure water in the third vessel 4, and cleaned in running water for one minute (step S3).

Further, the wafers 7, together with the carrier 8, were immersed in solution of hydrogen peroxide in the fourth vessel 3 for one minute. Herein, a solution of hydrogen peroxide at concentration of 10 mass % was used (step S4).

Still more, the wafers 7, together with the carrier 8, were immersed in ultrapure water in the fifth vessel 6, and cleaned in running water for one minute (step S5).

Finally, the wafers 7, together with the carrier 8, were conveyed into a spin dryer (not shown), and held by a holder. By spin rotation of wafers 7 at rotating speed of 1000 to 2000 rpm, remaining liquid was removed from wafers 7, and the surface of wafers 7 was dried (step S6).

The impurity concentration of the surface of Ge wafers 7 after chemical cleaning was observed by x-ray photoelectron spectroscopy, and a microscopic photograph is shown in FIG. 2. As clear from FIG. 2, on the surface of Ge wafer 7, the metal impurity was lower than $10^{11}$ atoms/cm$^2$, which was below the limit of observation, and the existence of metal impurity was decreased to a practically problem-free level.

Also as clear from FIG. 2, the density of both oxygen atoms and carbon atoms was suppressed below $3\times10^{13}$ atoms/cm$^2$, and the effect of cleaning was evident.

As a result of observation of Ge surface by interference microscope, disintegration of flatness due to overetching was not observed at all. The same results were obtained in SiGe substrates.

Comparative Example

By way of comparison, the same Ge wafers 7 as in Example 1 were cleaned by RCA method. Conditions of RCA method are shown in 1 to 12 below.

1. Cleaning in ultrapure water for 5 minutes.

2. Immersing in mixed solution of $NH_4OH$, $H_2O_2$, and $H_2O$ (1:2:7) at 75° C. for five minutes.

3. Cleaning in ultrapure water for 5 minutes.

4. Immersing in 1% hydrofluoric acid at room temperature for one minute.

5. Cleaning in ultrapure water for five minutes.

6. Immersing in mixed solution of HCl, $H_2O_2$, and $H_2O$ (1:2:7) at room temperature for five minutes.

7. Cleaning in ultrapure water for five minutes.

8. Immersing in 1% hydrofluoric acid at room temperature for one minute.

9. Cleaning in ultrapure water for five minutes.

10. Immersing in mixed solution of $H_2SO_4$, $H_2O_2$, and $H_2O$ (1:2:7) at room temperature for more than five minutes.

11. Cleaning in ultrapure water for five minutes.

12. Drying by spin rotation.

Figure 3:
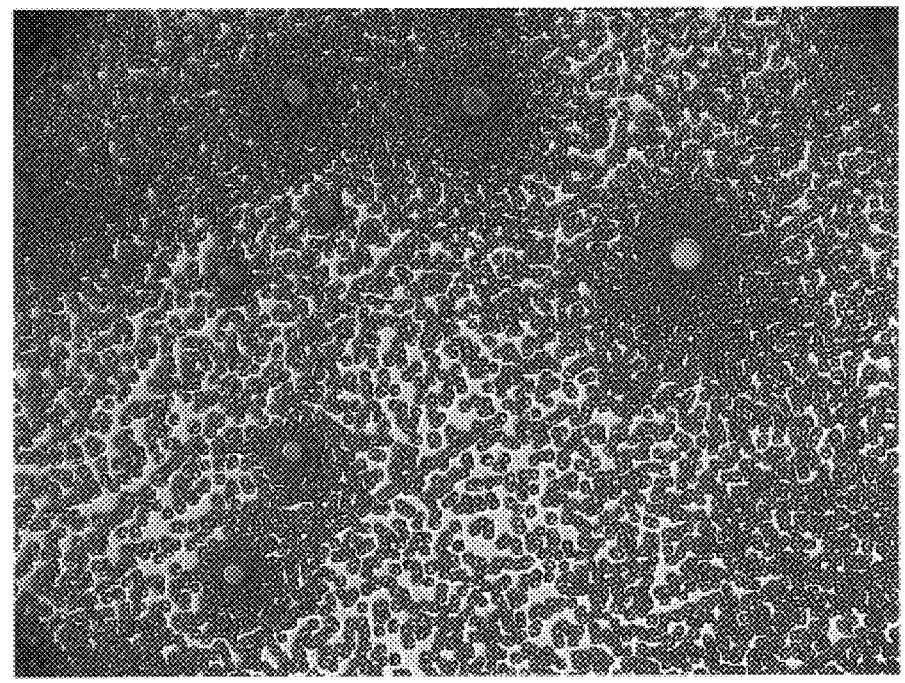
FIG. 3 is a microscopic photograph showing the surface of Ge substrate cleaned by RCA method as comparative example.

FIG. 3 is a microscopic photograph showing results of observation of the Ge wafer surface of comparative example by interference microscope. As clear from FIG. 3, the wafer surface was undulated.

EXAMPLE 2

Figure 4:
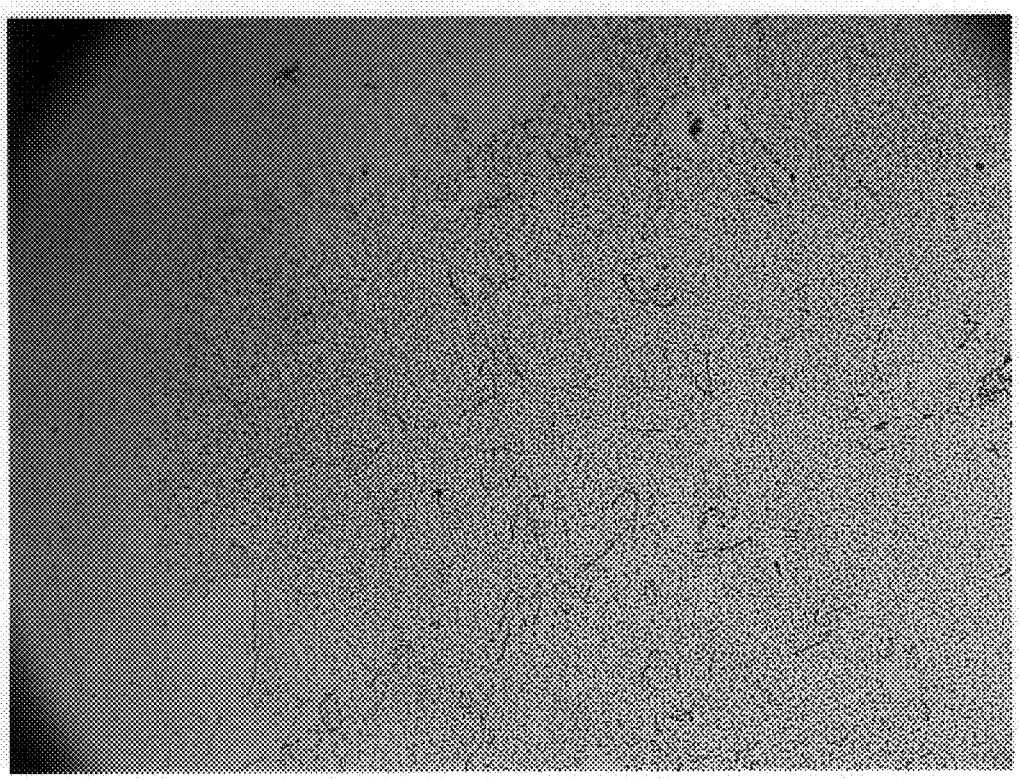
FIG. 4 is a microscopic photograph showing the surface (overetching state) of Ge substrate cleaned by a surface cleaning method of semiconductor substrate in a second embodiment of the invention.

Referring to FIG. 5 and FIG. 4, a method of example 2 of the invention is explained. In Example 2, explanation of same parts as in Example 1 is omitted.

In Example 2, the surface of Ge wafers was cleaned by varying the concentration of solution of hydrofluoric acid at step S2. That is, at step S2, the concentration of solution of hydrofluoric acid was varied in six types, 1%, 2%, 5%, 6%, 7.5%, and 10%, and the surface of the substantially same Ge wafers was cleaned. Except for step S2, conditions in other steps S1, and S3 to S6 were same as in Example 1.

FIG. 4 is a microscopic photograph showing results of observation of the Ge wafer surface treated in 6% solution of hydrofluoric acid by interference microscope. As clear from FIG. 4, when the concentration of solution of hydrofluoric acid is more than 6 mass %, disintegration of flatness probably due to overetching was observed. On the other hand, the surface of Ge wafer treated in 5% solution of hydrofluoric acid was substantially same as in FIG. 2. It was hence known that the concentration of solution of hydrofluoric acid at step S2 should be 5 mass % or less.

Figure 6:
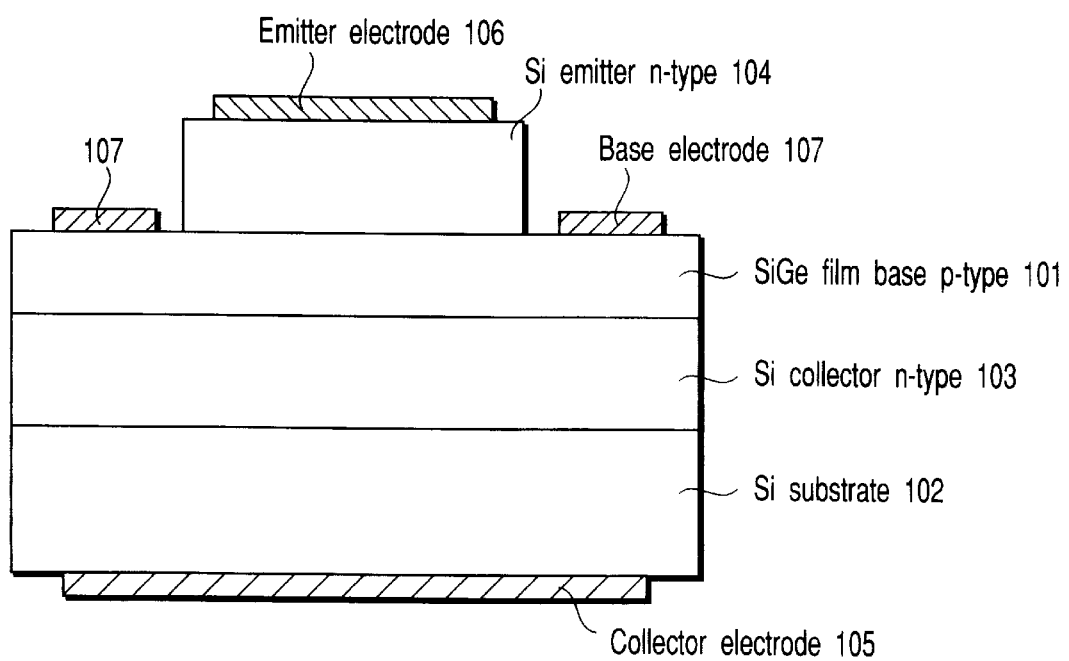
FIG. 6 is a schematic sectional view showing an example of bipolar transistor.

FIG. 6 is a sectional view showing a typical hetero junction type bipolar transistor for general use. At the face side of an n type Si substrate 102, an n type Si film 103, a p type SiGe film 101, and an n type Si film 104 are deposited sequentially. The p type SiGe film 101 corresponds to the base of transistor, the n type Si substrate 102 and n type Si film 103 to the collector of transistor, and the n type Si film 104 to the emitter of transistor.

Part of the n type Si film 104 was lost, and the p type SiGe film 101 was exposed in the lost area. A base electrode 107 composed of metal terminal contacts and conducts with the exposed area of the p type SiGe film 101.

An emitter electrode 106 composed of other metal terminal contacts and conducts with the intact area (emitter) of the n type Si film 104.

Further, at the back side of the n type Si substrate 102, a collector electrode 105 composed of a different metal terminal is formed.

In such HBT, the p type SiGe film 101 functioning as the base is low in input impedance, and the time constant determined by the parasitic capacitance at the junction of base and collector, and base and emitter, and the input impedance of the base is lowered, so that high speed operation is realized.

The p type SiGe film is a mixed crystal film consisting of Si crystal and Ge crystal, and its crystal structure is similar to a diamond structure. Usually, the p type SiGe film has a Ge concentration of 50 atom. % or less.

According to the invention, impurities (carbide and metal foreign matter, oxide) are removed from the surface of the substrate having a surface layer composed of Ge or SiGe while the flatness of the surface is not deteriorated. Thus the defect density on the hetero junction boundary can be lowered.

Also according to the invention, by defining the film thickness of impurity layer (oxide) and further defining an appropriate density of impurity atoms (metal foreign matters), the product yield of electronic devices can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface treatment method of semiconductor substrate comprising the steps of:

(a) immersing in a solution of hydrofluoric acid a substrate of a first conductive type having in a surface layer at least one of Ge and a SiGe mixture, and removing foreign matters from the surface of the substrate without overetching the surface of the substrate, (b) pouring pure water on the substrate to wash away the solution of hydrofluoric acid applied in the step (a) from the surface of the substrate, and (c) immersing the substrate in a solution of hydrogen peroxide, and removing foreign matters from the surface of the substrate without overetching the surface of the substrate.

2. The method according to claim 1, wherein the solution of hydrofluoric acid in the step (a) includes hydrofluoric acid of 5 mass % or less.

3. The method according to claim 1,
wherein the solution of hydrofluoric acid in the step (a) includes hydrofluoric acid of 1 mass % or more.

4. The method according to claim 1,
further comprising a step (d) of pouring pure water on the substrate to wash away the solution of hydrogen peroxide applied in the step (c) from the surface of the substrate, and removing the water applied on the surface of the substrate and then drying the substrate.

5. The method according to claim 1, further comprising, the substrate is washed by running pure water before the step (a).

6. The method according to claim 1,
wherein, in the step (b), a washing vessel is filled with pure water, the substrate is immersed in pure water in the washing vessel, and pure water is further supplied into the washing vessel while pure water is discharged from the washing vessel to form a flow of pure water in the washing vessel, and the surface of the substrate contacts with a running flow of pure water.

7. The method according to claim 4,
wherein, in the step (d), a washing vessel is filled with pure water, the substrate is immersed in pure water in the washing vessel, and pure water is further supplied into the washing vessel while pure water is discharged from the washing vessel to form a flow of pure water in the washing vessel, and the surface of the substrate contacts with a running flow of pure water.

8. The method according to claim 1,
further comprising putting substrates in a carrier, and arranging a vessel containing a solution of hydrofluoric acid, a vessel containing running flow of pure water, and a vessel containing a solution of hydrogen peroxide sequentially in series, wherein
  in the step (a), the carrier containing the substrates is conveyed into the vessel of solution of hydrofluoric acid, the carrier containing the substrates is immersed in the solution of hydrofluoric acid, and the carrier containing the substrates is lifted from the solution of hydrofluoric acid,
  in the step (b), the carrier containing the substrates is transferred from the vessel of solution of hydrofluoric acid into the vessel of running flow of pure water, the carrier containing the substrates is immersed in the running flow of pure water, and the carrier containing the substrates is lifted from the running flow of pure water, and
  in the step (c) the carrier containing the substrates is transferred from the vessel of running flow of pure water into the vessel of solution of hydrogen peroxide, the carrier containing the substrates is immersed in the solution of hydrogen peroxide, and the carrier containing the substrates is lifted from the solution of hydrogen peroxide.

9. The method according to claim 1,
further comprising putting a single substrate in a carrier, and arranging a vessel containing a solution of hydrofluoric acid, a vessel containing running flow of pure water, and a vessel containing a solution of hydrogen peroxide sequentially in series, wherein
  in the step (a), the carrier containing the substrate is conveyed into the vessel of solution of hydrofluoric acid, the carrier containing the substrate is immersed in the solution of hydrofluoric acid, and the carrier containing the substrate is lifted from the solution of hydrofluoric acid,
  in the step (b), the carrier containing the substrate is transferred from the vessel of solution of hydrofluoric acid into the vessel of running flow of pure water, the carrier containing the substrate is immersed in the running flow of pure water, and the carrier containing the substrate is lifted from the running flow of pure water, and
  in the step (c) the carrier containing the substrate is transferred from the vessel of running flow of pure water into the vessel of solution of hydrogen peroxide, the carrier containing the substrate is immersed in the solution of hydrogen peroxide, and the carrier containing the substrate is lifted from the solution of hydrogen peroxide.

10. The method according to claim 1,
wherein, in the step (a), the substrate is immersed in the solution of hydrofluoric acid at room temperature for at least 1 minute.

11. The method according to claim 1,
wherein, in the step (b), the substrate is immersed in a running flow of pure water at room temperature for at least one minute.

12. The method according to claim 1,
wherein, in the step (a), the substrate is immersed in the solution of hydrogen peroxide at room temperature for at least one minute.

13. The method according to claim 4,
wherein oxides, metal impurities, and carbon impurities are removed from the surface of the substrate in the steps (a) to (d), in order that the defect density on a hetero junction boundary may be $3 \times 10^{13}/cm^2$ or less when a hetero junction is formed by depositing on the substrate a film of a second conductive type of Ge or a SiGe mixture.

* * * * *